(12) United States Patent
Lin et al.

(10) Patent No.: US 6,924,874 B2
(45) Date of Patent: Aug. 2, 2005

(54) METHOD OF FORMING A LIQUID CRYSTAL DISPLAY

(75) Inventors: Gwo-Long Lin, Hsin-Chu (TW); I-Min Lu, Taipei (TW); Chu-Jung Shih, Taipei (TW); Shyuan-Jeng Ho, Hsin-Chu (TW); I-Wei Wu, Hsin-Chu (TW)

(73) Assignee: Toppoly Optoelectronics Corp., Miao-Li Hsien (TW)

( * ) Notice: Subject to any disclaimer, the term of this patent is extended or adjusted under 35 U.S.C. 154(b) by 85 days.

(21) Appl. No.: 10/250,122

(22) Filed: Jun. 5, 2003

(65) Prior Publication Data

US 2004/0096999 A1 May 20, 2004

(30) Foreign Application Priority Data

Nov. 15, 2002 (TW) ........................................ 91133557 A

(51) Int. Cl.⁷ ................................................. G02F 1/13
(52) U.S. Cl. ..................... 349/187; 438/373; 438/506
(58) Field of Search ............................ 349/187; 438/30, 438/373, 506, 514

(56) References Cited

U.S. PATENT DOCUMENTS 6,249,327 B1 * 6/2001 Murade et al. ................ 349/43
6,642,073 B1 * 11/2003 Zhang et al. .................. 438/30

* cited by examiner

Primary Examiner—Tarifur R. Chowdhury
Assistant Examiner—Richard Kim
(74) Attorney, Agent, or Firm—Winston Hsu

(57) ABSTRACT

The present invention provides a method of forming a liquid crystal display (LCD). Active layers of N-type and P-type low temperature polysilicon thin film transistors and a bottom electrode of a storage capacitor are formed first. Then a N-type source/drain is formed and the bottom electrode is doped with dopants. A gate insulator, a gate electrode, a capacitor dielectric, and a top electrode are thereafter formed. After that, a P-type source/drain is formed. Finally, a source interconnect, a drain interconnect, and a pixel electrode of the liquid crystal display are formed.

20 Claims, 16 Drawing Sheets

METHOD OF FORMING A LIQUID CRYSTAL DISPLAY

BACKGROUND OF INVENTION

1. Field of the Invention

The present invention relates to a method of fabricating a low temperature polysilicon thin film transistor liquid crystal display (LTPS TFT-LCD), and more particularly, to a method of fabricating a low temperature polysilicon thin film transistor liquid crystaldisplay with precise alignment and superior reliability by utilizingnine photo-etching-processes (PEPs).

2. Description of the Prior Art

Nowadays, a liquid crystal display (LCD) is the most mature flat panel display technique. The applications for a liquid crystal display are extensive and include mobile phones, digital cameras, video cameras, notebooks, and monitors. Due to the high quality vision requirements and the expansion of new application fields, the LCD has developed toward high quality, high resolution, high brightness, and low price. The low temperature polysilicon thin film transistor (LTPS-TFT), having a character of being actively driven, is a break-through in achieving the above objective. Therefore, the technological innovation based on this concept has become an important subject.

Please refer to FIG. 1 to FIG. 8 that are schematic diagrams of a method for forming a low temperature polysilicon thin film transistor liquid crystal display (LTPS TFT-LCD) according to a prior art. The prior art low temperature polysilicon thin film transistor liquid crystal display (LTPS TFT-LCD) 98 is formed on an insulation substrate 10. The insulation substrate 10, composed of transparent materials, may be a glass substrate or a quartz substrate. A pixel array area 11 and a periphery circuit area 13 are comprised on a surface of the insulation substrate 10.

An amorphous silicon thin film (α–Si thin film, not shown) is formed on the surface of the insulation substrate 10 first. Then an excimer laser annealing (ELA) process is performed to re-crystallize the amorphous silicon thin film (not shown) into a polysilicon layer (not shown). A first photo-etching-process (PEP-1) is thereafter performed to define an active area 12 in the pixel array area 11 and at least one active area 14 in the periphery circuit area 13. A source region (not shown), a drain region (not shown), a channel region (not shown), and a predetermined region for a bottom storage electrode (not shown) are comprised in the active area 12; a source region (not shown), a drain region (not shown), and a channel region (not shown) are comprised in each active area 14.

As shown in FIG. 2, a second photo-etching-process (PEP-2) is performed to form a photoreisist layer 16 on the top surface of the insulation substrate 10. The photoresist layer 16 is used to define the sites for the bottom storage electrode 18 in the pixel array area 11. After that, an ion implantation process is performed to dope high concentration N-type dopants into the exposed portion of the active area 12 in the pixel array area 11, completing the fabrication of the bottom storage electrode 18. The first photoresist layer 16 is then removed.

As shown in FIG. 3, an isolation layer 22 and a first conductive layer (not shown) are formed on the surface of the insulation substrate 10 sequentially.

Then a third photo-etching-process (PEP-3) is performed to simultaneously form a gate electrode 24 of a thin film transistor and a top storage electrode 26 on top of the bottom storage electrode 18 in the pixel array area 11, and a gate electrode 28 of an N-type metal-oxide-semiconductor (NMOS) and a gate electrode 32 of a P-type metal-oxide-semiconductor (PMOS), respectively, in the periphery circuit area 13.

As shown in FIG. 4, an etching process is performed, by utilizing the above mentioned gate electrode 24, the gate electrode 28, the gate electrode 32, and the top storage electrode 26 as etching masks, to remove portions of the isolation layer 22 to form the gate insulating layers 34, 36, 38, and the capacitor dielectric layer 42. The manufacturing of the storage capacitor 44 is thus completed.

After that, an ion implantation process, by utilizing the gate electrodes 24, 28, 32 as masks, is performed to dope low concentration N-type ions into the active areas 12, 14 at either side of the gate electrodes 24, 28, 32 to form the lightly doped drains 46, 48, 52. Due to the low concentration N-type ions implanted in this ion implantation process, the doping concentration of the bottom storage electrode 18 is not affected.

As shown in FIG. 5, a fourth photo-etching-process (PEP-4) is performed to form a photoresist layer 54 on the top surface of the insulation substrate 10. The photoresist layer 54 covers the gate electrode 24 and the predetermined region for a lightly doped drain 56 in the pixel array area 11 and simultaneously covers the predetermined region for a P-type metal-oxide-semiconductor in the periphery circuit area 13. An ion implantation process is thereafter performed to dope high concentration N-type ions to form a source electrode 62 and a drain electrode 64 of a thin film transistor 58 in the active area 12 in the pixel array area 11 and simultaneously form a source electrode 68 and a drain electrode 72 of an N-type metal-oxide-semiconductor 66 in the active area 14 in the periphery circuit area 13.

The photoresist layer 54 is removed. As shown in FIG. 6, a fifth photo-etching-process (PEP-5) is performed to form a photoresist layer 74 on the top surface of the insulation substrate 10. The photoresist layer 74 exposes the predetermined region for the P-type metal-oxide-semiconductor 76 in the periphery circuit area 13. After that, an ion implantation process is performed to dope high concentration P-type ions to form a source electrode 78 and a drain electrode 82 of the P-type metal-oxide-semiconductor 76 in the active area 14 in the periphery circuit area 13. Due to the high concentration P-type ions implanted in this ion implantation process, the previously formed N-type lightly doped drain 52 (shown in FIG. 5) is compensated and the source electrode 78 and the drain electrode 82 are thus formed. The photoresist layer 74 is then removed.

As shown in FIG. 7, an isolation layer 84 is formed on the surface of the insulation substrate 10. The isolation layer 84 covers the gate electrodes 24, 28, 32 and the top storage electrode 26. Then a sixth photo-etching-process (PEP-6) is performed to remove portions of the isolation layer 84 to form a plurality of contact holes 85. The contact holes 85 are electrically connected to the source electrodes 62, 68, 78 and the drain electrodes 72, 82, respectively. A source wire 86, electrically connected to the source electrode 62, is formed on top of the contact hole 85 in the pixel array area 11. Source wires 88, electrically connected to the source electrodes 68, 78 respectively, are formed on top of the contact holes 85 in the periphery circuit area 13. A wire 92 electrically connecting the N-type metal-oxide-semiconductor 66 to the P-type metal-oxide-semiconductor 76 is formed to complete the manufacturing of the complementary metal oxide semiconductor (CMOS).

As shown in FIG. 8, an isolation layer 94 is formed on the surface of the entire structure to cover the isolation layer 84, the source wires 86, 88, and the wire 92. A seventh photo-etching-process (PEP-7) is performed to remove portions of the third isolation layer 94 to form a contact hole 95. The contact hole 95 extends downward and is electrically connected to the drain electrode 64. A transparent conductive layer is thereafter formed on the isolation layer 94. Finally, an eighth photo-etching-process (PEP-8) is performed to remove portions of the transparent conductive layer to form a pixel electrode 96 on the isolation layer 94. The pixel electrode 96 is electrically connected to the drain electrode 64 downward though the contact hole 95 filled with the transparent conductive layer (not shown) to complete the fabrication of the low temperature polysilicon thin film transistor liquid crystal display 98.

However, the prior art method for forming the low temperature polysilicon thin film transistor liquid crystal display 98 results in a very severe problem. When forming the low storage electrode, the source electrode, the drain electrode, and the lightly doped drain according to the prior art method for forming the low temperature polysilicon thin film transistor liquid crystal display 98, three different photoresist layers and four different ion implantation processes are necessarily performed. When forming each photoresist layer, a photolithography process that tends to incur alignment error is required. After so many and complicated photolithography processes, defects are readily produced on the product. Especially the sum of the alignment error incurred from forming the gate electrode and the alignment errors incurred from forming the source electrode and the drain electrode of the thin film transistor in the pixel array area always results in the lightly doped drain having an uneven width. The asymmetric lightly doped drain cannot inhibit the hot electron effect. Moreover, an early breakdown of device is likely to happen. Therefore, it is very important to develop a method of forming a low temperature polysilicon thin film transistor liquid crystal display, so the manufacturing complexity is reduced and the number of photolithography processes is decreased to lower the probability of misalignment to improve the device defect problem and to ensure a certain production yield.

SUMMARY OF INVENTION

It is thereforean object of the claimed invention to provide a method of fabricating a low temperature polysilicon thin film transistor (LTPS TFT) liquid crystal display (LCD), especially a method of fabricating a low temperature polysilicon thin film transistor liquid crystal display with precise alignment and superior reliability by utilizingnine photo-etching-processes (PEPs).

According to the claimed invention, an insulation substrate is provided first. A pixel array area and a periphery circuit area are defined on the insulation substrate. A polysilicon layer is formed on a surface of the insulation substrate. Then a first photo-etching-process is performed to remove portions of the polysilicon layer to respectively form a first active area in the pixel array area and a second active area in the periphery circuit area. A source region, a drain region, a channel region, and a predetermined region for a bottom storage electrode are comprised in the first active area, a source region, a drain region, and a predetermined region for a channel region are comprised in the second active area. A first mask is formed on a surface of the entire structure by performing a second photo-etching-process to define the channel region in the first active area and the channel region in the second active area. A first ion implantation process is performed by utilizing the first mask as a mask. The first mask is removed.

A second mask is formed on the surface of the entire structure by performing a third photo-etching-process to define the source region, the drain region, and the bottom storage electrode in the first active area and the source region and the drain region in the second active area. A second ion implantation process is performed by utilizing the second mask as a mask to form a source electrode and a drain electrode in the first active area and in the second active area respectively and to dope the bottom storage electrode with dopants simultaneously. The second mask is removed.

A first isolation layer is formed on the surface of the entire structure. A metal layer is formed on a surface of the first isolation layer. The first isolation layer and the metal layer cover the first active area, the second active area, and the bottom storage electrode. A fourth photo-etching-process is performed to remove portions of the metal layer so as to form a gate insulating layer, a gate electrode, a capacitor dielectric layer, and a top storage electrode in the pixel array area and a gate insulating layer and a gate electrode in the periphery circuit area.

A third mask is formed on the surface of the entire structure by performing a fifth photo-etching-process to define a thin film transistor region. A third ion implantation process by utilizing the third mask as a mask is performed to form a source electrode and a drain electrode in the periphery circuit area. The third mask is removed.

A second isolation layer is formed on the surface of the entire structure to cover each gate electrode and the top storage electrode. A sixth photo-etching-process is performed to remove portions of the second isolation layer to form a first contact hole extending to the top surface of each source electrode and each drain electrode. A first conductive layer is formed on a surface of the second isolation layer to fill up the first contact hole. A seventh photo-etching-process is performed to remove portions of the first conductive layer to form a source wire and a drain wire in the pixel array area and the periphery circuit area respectively. The source wire and the drain wire are electrically connected to the source electrode and the drain electrode through the first contact hole respectively.

A third isolation layer is formed on the surface of the entire structure to cover the second isolation layer, the source wire, and the drain wire. An eighth photo-etching-process is performed to remove portions of the third isolation layer to form a second contact hole electrically connected to the drain wire. A second conductive layer is formed on the surface of the entire structure. A ninth photo-etching-process is performed to remove portions of the second conductive layer to form a pixel electrode electrically connected to the drain wire and the drain electrode though the second contact hole.

The method of fabricating the low temperature polysilicon thin film transistor liquid crystal display according to the present invention is to utilize a mask and a high concentration N-type ion implantation process to respectively form the source electrode and the drain electrode of the thin film transistor in the pixel array area, a source electrode and a drain electrode of the N-type metal-oxide-semiconductor in the periphery circuit, and to simultaneously dope the bottom electrode of the capacitor. Then a gate electrode is formed. A low concentration N-type ion implantation process is thereafter formed, by utilizing the gate electrode as a mask, to form a lightly doped drain of the thin film transistor in the pixel array area. (Or the low concentration N-type ion implantation process for forming the lightly doped drain is performed before forming the source electrode and the drain electrode of the thin film transistor in the pixel array area, the source electrode and the drain electrode of the N-type metal-oxide-semiconductor in the periphery circuit area, and doping the bottom electrode of the capacitor.) Finally, another mask is utilized and a high concentration P-type ion implantation process is performed to form the source electrode and the drain electrode of the P-type metal-oxide-semiconductor in the periphery circuit area.

Therefore, the total number of the photolithography processes and the ion implantation processes is decreased and the risk and the probability of occurring the alignment error are reduced. Not only the process is simplified, the performance reliability of the product is improved. Furthermore, the sum of the alignment error incurred from forming the gate electrode and the alignment error incurred from forming the source electrode and the drain electrode of the thin film transistor in the pixel array area will not result in an asymmetric lightly doped drain, improving the electrical performance of the product.

These and other objectives of the claimed invention will no doubt become obvious to those of ordinary skill in the art after having read the following detailed description of the preferred embodiment that is illustrated in the various figures and drawings.

DETAILED DESCRIPTION

Figure 1:
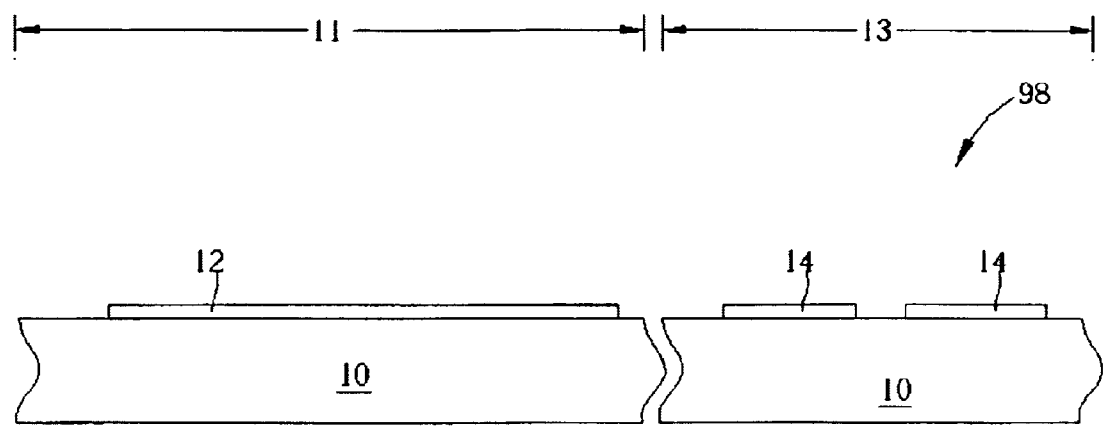
FIG. 1 to FIG. 8 are schematic diagrams of a method for forming a low temperature polysilicon thin film transistor (LTPS-TFT) liquid crystal display according to a prior art.
Figure 2:
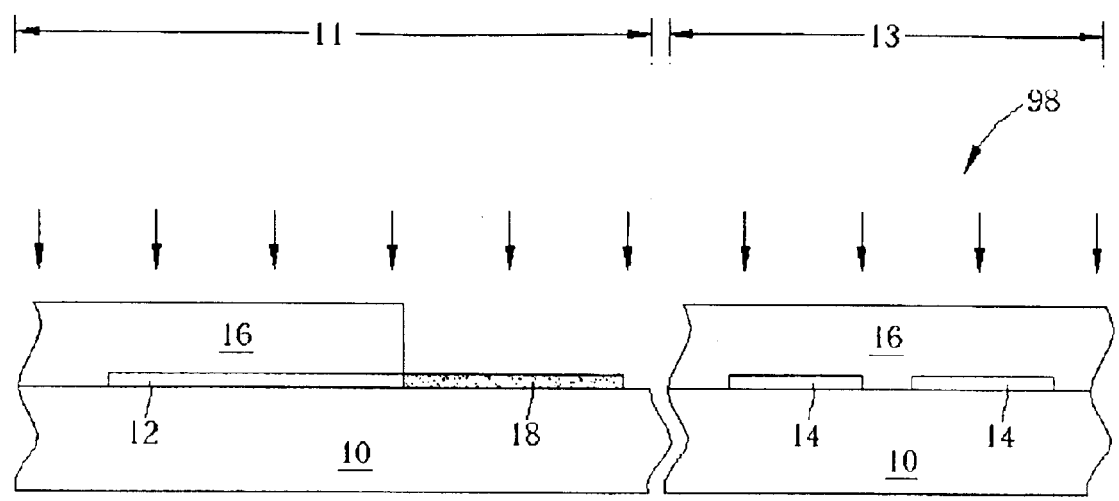
Figure 3:
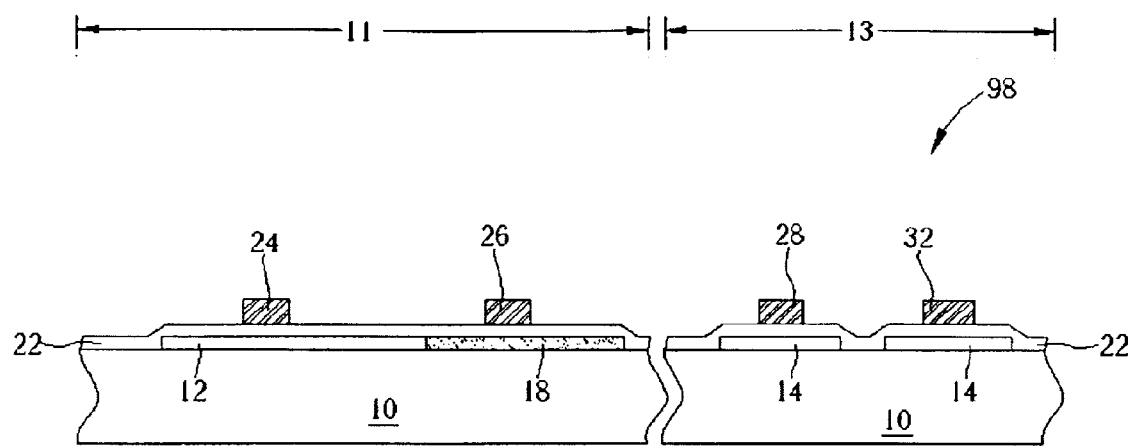
Figure 4:
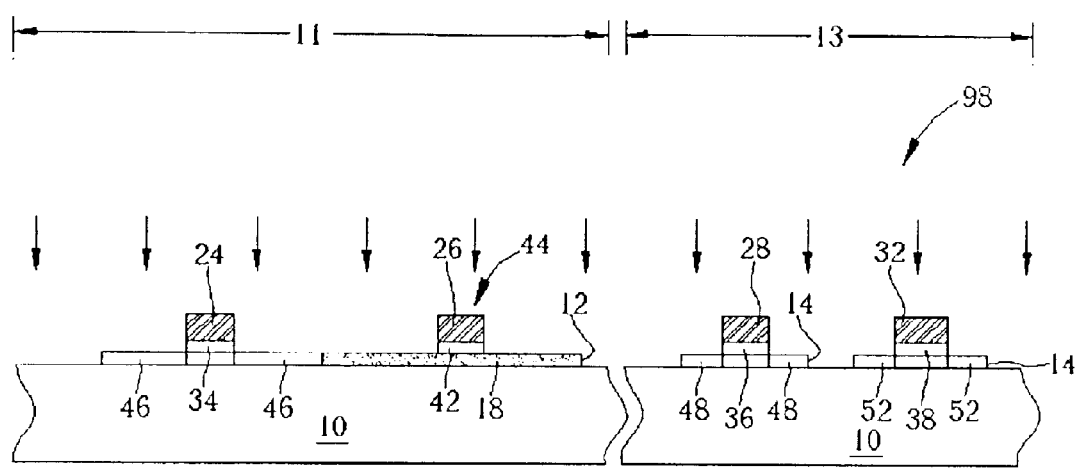
Figure 5:
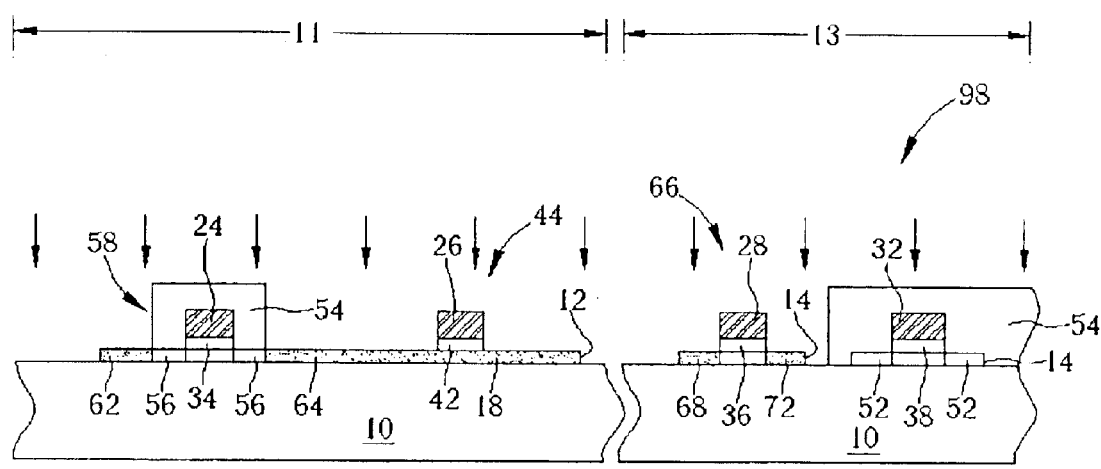
Figure 6:
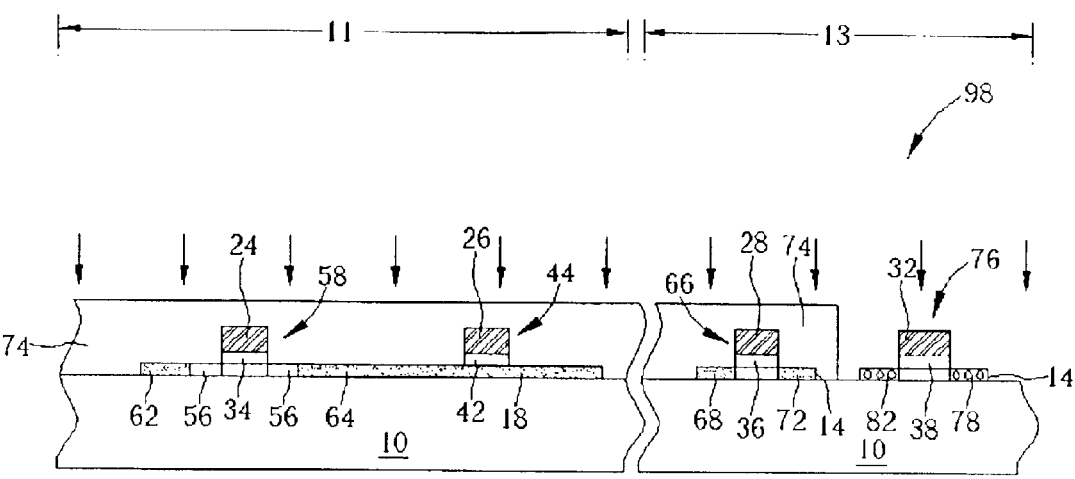
Figure 7:
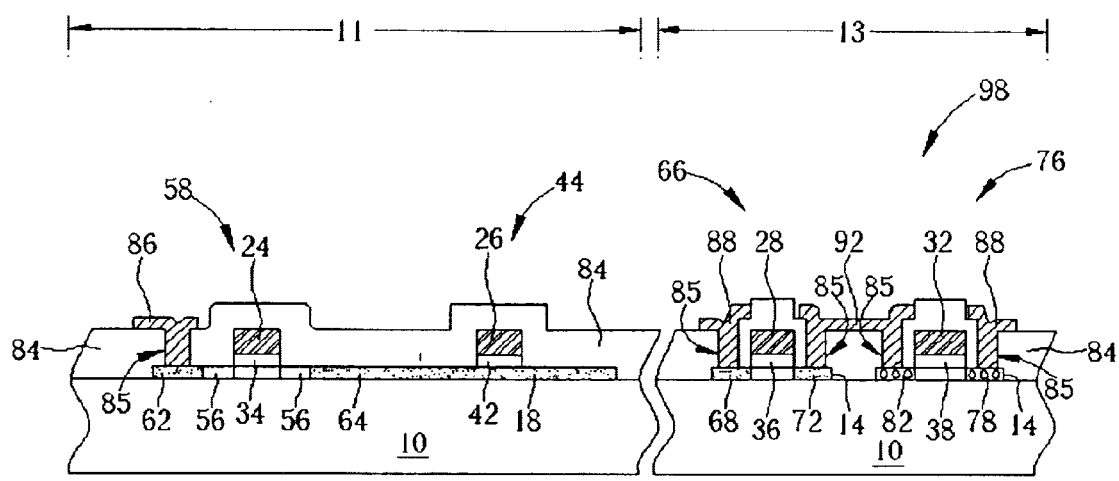
Figure 8:
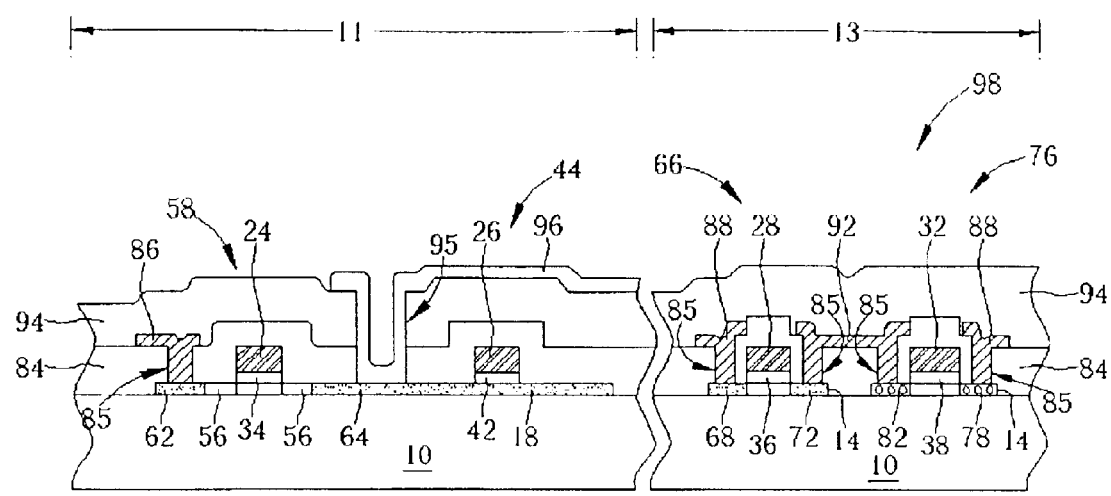
Figure 9:
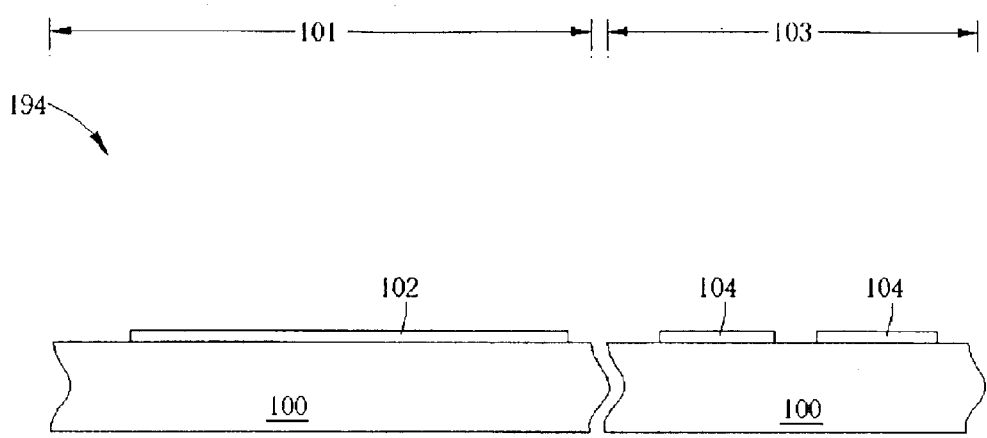
FIG. 9 to FIG. 16 are schematic diagrams of a method for forming a low temperature polysilicon thin film transistor liquid crystal display according to a present invention.

Please refer to FIG. 9 to FIG. 16 that are schematic diagrams of a method for forming a low temperature polysilicon thin film transistor liquid crystal display 194 according to a present invention. As shown in FIG. 9, the present invention low temperature polysilicon thin film transistor liquid crystal display is formed on an insulation substrate 100. The insulation substrate 100, composed of transparent materials, may be a glass substrate or a quartz substrate. A pixel array area 101 and a periphery circuit area 103 are comprised on a surface of the insulation substrate 100.

The present invention method utilizes a sputtering process or other deposition process to form an amorphous silicon thin film (Î±–Si thin film, not shown) on the surface of the insulation substrate 100 first. Then an excimer laser annealing (ELA) process is performed to re-crystallize the amorphous silicon thin film (not shown) into a polysilicon layer (not shown). A first photo-etching-process (PEP-1) is thereafter performed to remove portions of the polysilicon layer (not shown) to form an active area 102 in the pixel array area 101 and at least one active area 104 in the periphery circuit area 103. A source region (not shown), a drain region (not shown), a channel region (not shown), and a predetermined region for a bottom storage electrode (not shown) are comprised on a surface of the active area 102. A source region (not shown), a drain region (not shown), and a channel region (not shown) are comprised on a surface of each active area 104. It is worth noticing that the excimer laser annealing process may be performed after the first photo-etching-process.

Figure 10:
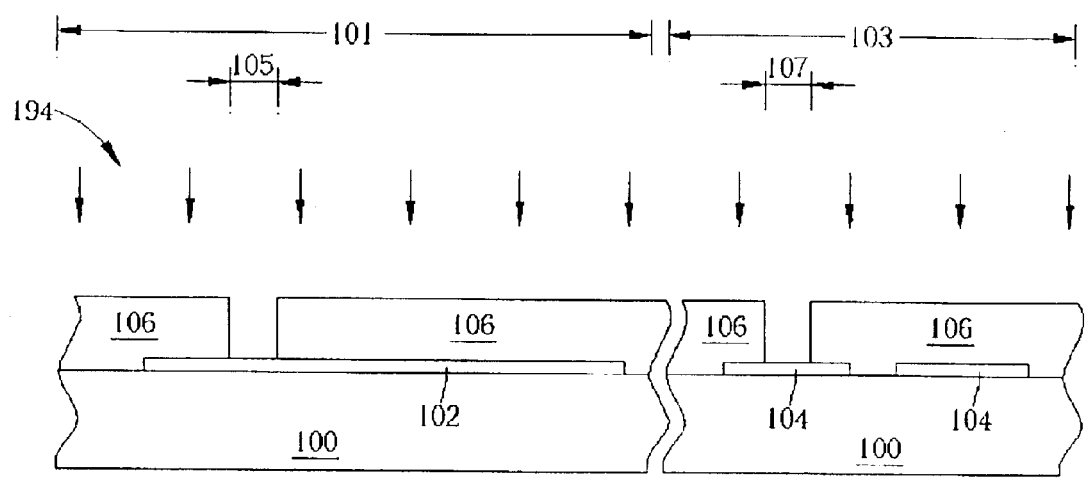

As shown in FIG. 10, a second photo-etching-process (PEP-2) is performed to form a first mask 106 on the insulation substrate 100. The first mask 106 exposes the channel region 105 of the N-type low temperature polysilicon thin film transistor (not shown) in the active area 102 and the channel region 107 of the N-type metal-oxide-semiconductor (not shown) in the active area 104. After that, an ion implantation process is performed by utilizing the first mask 106 as a mask.

The ion implantation process is a threshold voltage adjustment ion implantation process for adjusting the threshold voltage ($V_t$) for the subsequently formed N-type low temperature polysilcion thin film transistor (not shown) and N-type metal-oxide-semiconductor (not shown). The dopants for this ion implantation process comprise boron atoms ($B_{11}$) or boron fluoride($BF_2^+$).

Figure 11:
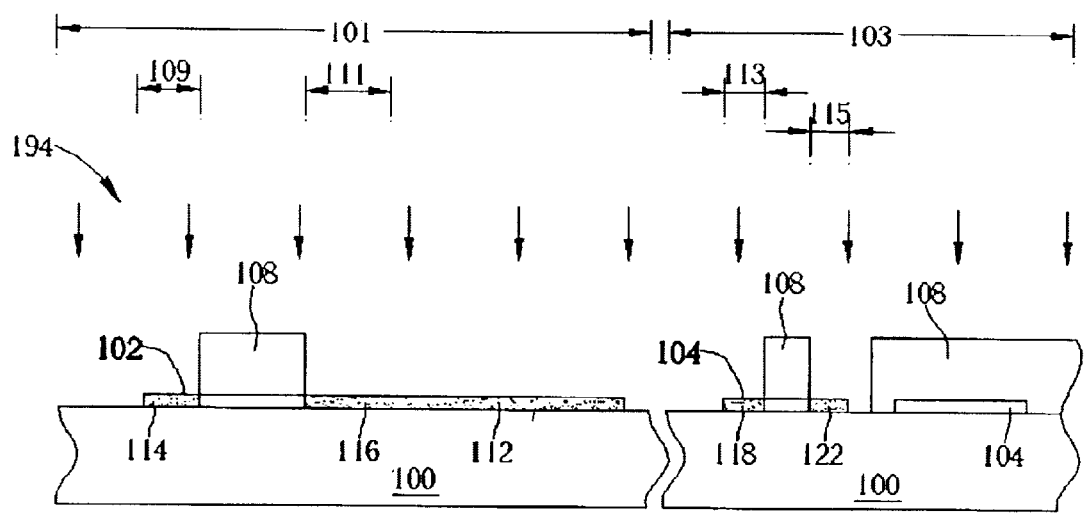

The first mask 106 is removed after the ion implantation process. As shown in FIG. 11, a third photo-etching-process (PEP-3) is performed to form a second mask 108 on the insulation substrate 100. The second mask 108 exposes a source region 109, a drain region 111, and a bottom storage electrode 112 in the active area 102 in the pixel array area 101, and simultaneously exposes a source region 113 and a drain region 115 of the N-type metal-oxide-semiconductor (not shown) in the periphery circuit area 103. In order to integrate the devices, the bottom storage electrode 112 is contiguous to the drain region 111 in the preferred embodiment of the present invention. An ion implantation process is then performed to dope high concentration N-type ions by utilizing the second mask 108 as a mask. A source electrode 114 and a drain electrode 116 of the low temperature polysilicon thin film transistor (not shown) are formed in the active area 102 in the pixel array area 101, the N-type dopants are doped into the low storage electrode 112, and a source electrode 118 and a drain electrode 122 of the N-type metal-oxide-semiconductor (not shown) are simultaneously formed in the active area 104 in the periphery circuit area 103.

Figure 12:
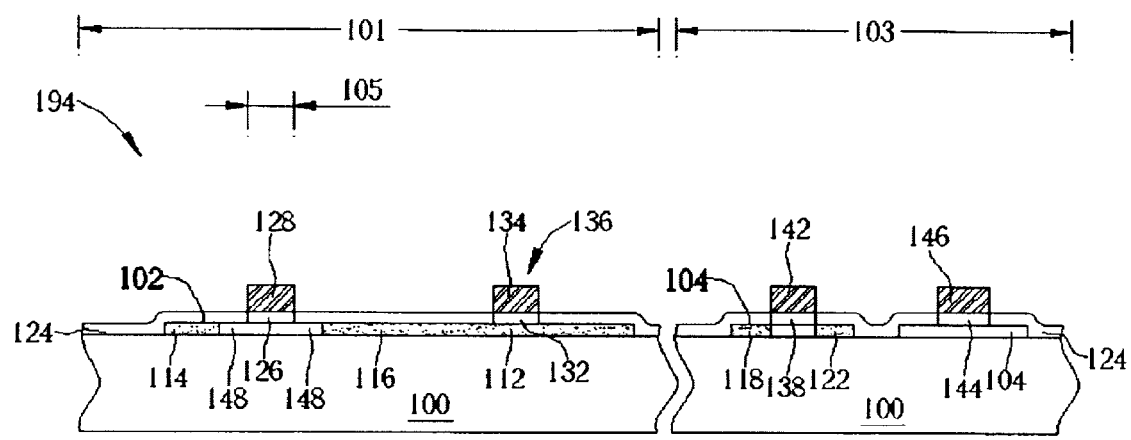

The second mask 108 is removed after the ion implantation process. As shown in FIG. 12, a first isolation layer 124 and a metal layer (not shown) are formed on a surface of the entire structure sequentially. The first isolation layer 124 and the metal layer (not shown) cover the active areas 102, 104, and the bottom storage electrode 112. The first isolation layer 124 is a single-layered structure or a double-layered structure. The material composition of the first isolation layer 124 comprises tetra-ethyl-ortho-silicate oxide (TEOS-oxide) deposited by utilizing tetra-ethyl-ortho-silicate (TEOS) as a reaction gas, silicon oxide, silicon nitride, or combination thereof. The material composition of the metal layer (not shown) comprises tungsten (W) or chrome (Cr). Furthermore, a cleaning process may be performed before forming the first isolation layer 124. By utilizing an ozone solution, the surfaces of the active areas 102, 104 and a surface of the bottom storage electrode 112 are cleaned to remove the native oxide layer (not shown) on the active areas 102, 104 and the bottom storage electrode 112. The surfaces of the active areas 102, 104 and the bottom storage electrode 112 thus become passive to prevent the polysilicon from oxidizing before the first isolation layer 124 is formed to ensure the channel region is not contaminated.

A fourth photo-etching-process (PEP-4) is thereafter performed to remove portions of the metal layer (not shown) to form a gate insulating layer 126 and a gate electrode 128 of the low temperature polysilicon thin film transistor (not shown) on the channel region 105 in the pixel array area 101 and to form a capacitor dielectric layer 132 and a top storage electrode 134 on top of the bottom storage electrode 112 and complete the fabrication of the storage capacitor 136. Simultaneously, gate insulating layers 138, 144 and gate electrodes 142, 146 of the N-type metal-oxide-semiconductor (not shown) and the P-type metal-oxide-semiconductor (not shown) respectively are formed in the periphery circuit area 101. It is worth noticing that since the first isolation layer 124 is not etched, the first isolation layers 124 underneath the gate electrodes 128, 142, 146 and the top storage electrode 134 are taken as the gate insulating layers 126, 138, 144 and the capacitor dielectric layer 132 in the figure. The thickness of the gate insulating layers 126, 138, 144 are all less than the thickness of the gate electrodes 128, 142, 146.

Figure 13:
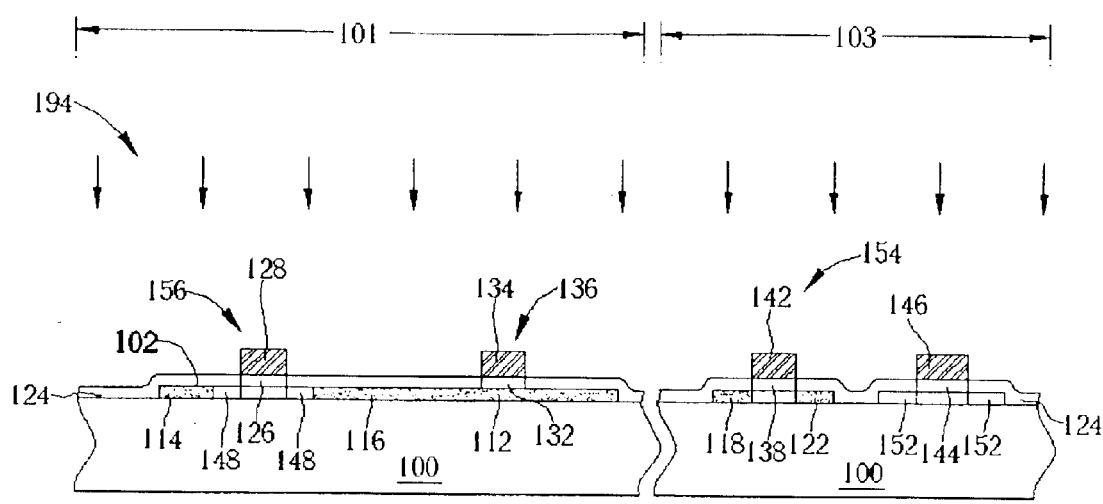

As shown in FIG. 13, an ion implantation process is performed after the forth photo-etching-process is performed. This ion implantation process is an N-type blank ion implantation process, and the doping concentration is much lower than the doping concentration of the ion implantation process performed in FIG. 11 (high concentration N-type ions were doped). The objective of this ion implantation process is to dope low concentration N-type dopants into the active areas 102, 104 to form a lightly doped drain 148 of the low temperature polysilcion thin film transistor 156 in the pixel array area 101 and lightly doped drain regions 152 at either side of the gate electrode 146 in the periphery circuit area 103. The manufacturing of the low temperature polysilcion thin film transistor 156 in the pixel array area 101 and the N-type metal-oxide-semiconductor 154 in the periphery circuit area 103 are therefore completed. Due to the very low concentration N-type ions doped in this ion implantation process, the source electrode 118 and the drain electrode 122 of the N-type metal-oxide-semiconductor 154 are not affected by this ion implantation process.

Figure 14:
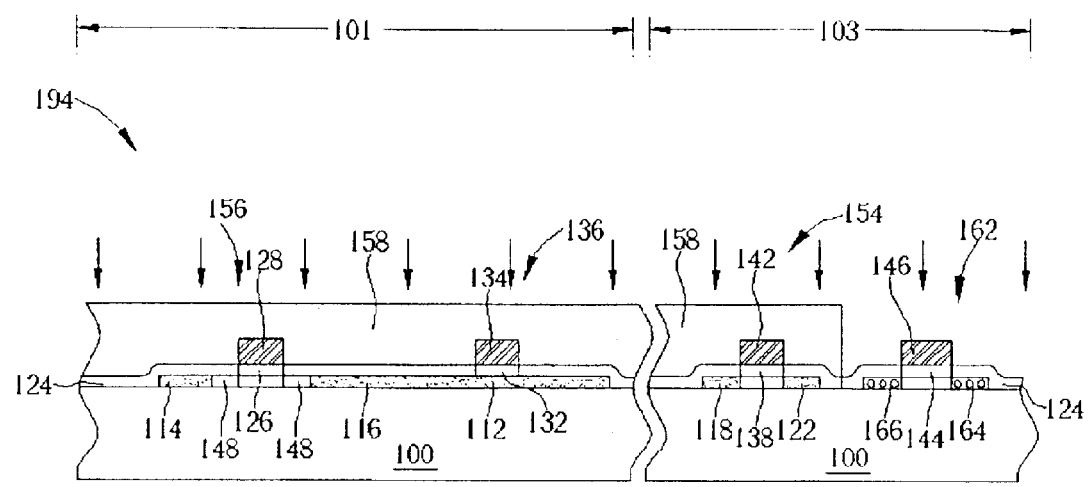

As shown in FIG. 14, a third mask 158 is formed on the surface of the entire structure by performing a fifth photo-etching-process (PEP-5). The third mask 158 only exposes the P-type metal-oxide-semiconductor 162 in the periphery circuit area 103. An ion implantation process is performed by utilizing the third mask 158 as a mask to dope high concentration P-type ions. A source electrode 164 and a drain electrode 166 of the P-type metal-oxide-semiconductor 162 are formed in the periphery circuit area 103 to complete the fabrication of the P-type metal-oxide-semiconductor in the periphery circuit area 103.

Due to the very low concentration N-type ions doped in the ion implantation process performed in FIG. 13, the source electrode 164 and the drain electrode 166 of the P-type metal-oxide-semiconductor 162 are not affected after the ion implantation process performed in FIG. 14. In addition, the N-type blank ion implantation process performed in FIG. 13 may be performed after a threshold voltage adjustment ion implantation process and after removing the first mask 106. In this case, another mask may be formed, depending on the device design, to perform the N-type blank ion implantation process. The manufactured device is not affected at all.

Actually, both the metal-oxide-semiconductor and the low temperature polysilcion thin film transistor are formed in a same processing method by employing the concept of system on panel (SOP). Therefore, they are regarded as the same device.

Figure 15:
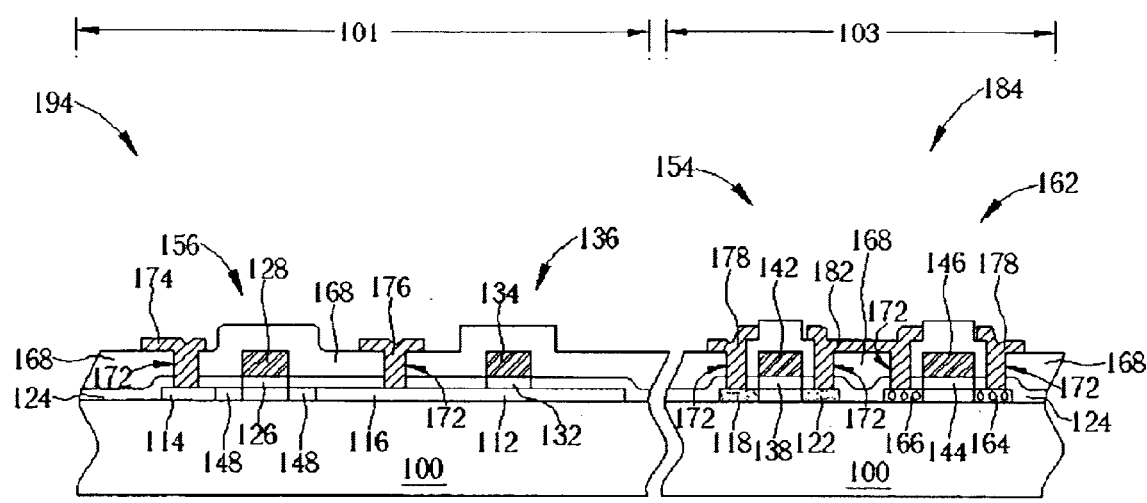

The third mask 158 is removed. As shown in FIG. 15, a second isolation layer 168 is formed on the surface of the entire structure. The second isolation layer 168 comprises a silicon oxide layer, a silicon nitride layer, or a silicon oxynitride layer. After that, a sixth photo-etching-process (PEP-6) is performed to remove portions of the second isolation layer 168 to form a plurality of first contact holes 172, electrically connected to the source electrodes 114, 118, 164 and the drain electrodes 116, 122, 166, respectively.

A conductive layer (not shown) is thereafter formed on the surface of the entire structure. The conductive layer (not shown) fills up the first contact hole 172. Then a seventh photo-etching-process (PEP-7) is performed to remove portions of the conductive layer (not shown) to form a source wire 174, electrically connected to the source electrode 114, on the surface of the second isolation layer 168 used as a data line of the low temperature polysilicon thin film transistor liquid crystal display and to form a drain wire 176, electrically connected to the drain electrode 116 in the pixel array area 101. Source wires 178, electrically connected to the source electrodes 118, 164 respectively, and a wire 182, electrically connected the N-type metal-oxide-semiconductor 154 and to the P-type metal-oxide-semiconductor 162, are formed on the surface of the second isolation layer 168 in the periphery circuit area 103 so as to complete the manufacturing of the complementary metal oxide semiconductor (CMOS).

Figure 16:
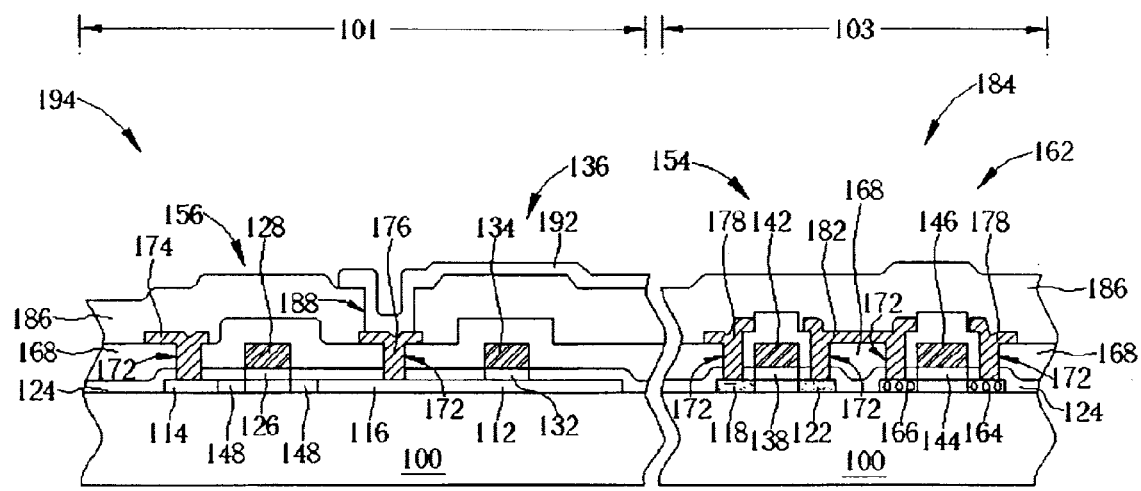

As shown in FIG. 16, a third isolation layer 186 is formed on the surface of the entire structure to cover the second isolation layer 168, the source wire 174, 178, the drain wire 176, and the wires 182. The third isolation layer 186, being a planarization layer, comprises a silicon oxide layer, a silicon nitride layer, or a tetra-ethyl-ortho-silicate oxide (TEOS-oxide) layer deposited by utilizing tetra-ethyl-ortho-silicate (TEOS) as a reaction gas. An eighth photo-etching-process (PEP-8) is performed to remove portions of the third isolation layer 186 to form a second contact hole 188 electrically connected to the drain wire 176. After that, a transparent conductive layer (not shown) is formed on the entire surface of the structure. The material composition of the transparent conductive layer (not shown) comprises indium tin oxide(ITO) or indium zinc oxide (IZO). Finally, a ninth photo-etching-process (PEP-9) is performed to remove portions of the transparent conductive layer to form a pixel electrode 192. The pixel electrode 192 is electrically connected to the drain wire 176 and the drain electrode 116 downward though the second contact hole 188 filled with the transparent conductive layer (not shown) to complete the fabrication of the low temperature polysilicon thin film transistor liquid crystal display 194.

The method of fabricating the low temperature polysilicon thin film transistor liquid crystal display according to the present invention is to utilize a mask and a high concentration N-type ion implantation process to respectively form the source electrode and the drain electrode of the thin film transistor in the pixel array area, a source electrode and a drain electrode of the N-type metal-oxide-semiconductor in the periphery circuit, and to simultaneously dope the bottom electrode of the capacitor. A gate electrode is then formed. A low concentration N-type ion implantation process is thereafter formed, by utilizing the gate electrode as a mask, to form a lightly doped drain of the thin film transistor in the pixel array area. The low concentration N-type ion implantation process for forming the lightly doped drain may be performed before forming the source electrode and the drain electrode of the thin film transistor in the pixel array area, the source electrode and the drain electrode of the N-type metal-oxide-semiconductor in the periphery circuit area, and doping the bottom electrode of the capacitor. Finally, another mask is utilized and a high concentration P-type ion implantation process is performed to form the source electrode and the drain electrode of the P-type metal-oxide-semiconductor in the periphery circuit area.

According to the present invention method, not only the total number of the photolithography processes and the ion implantation processes is decreased, the alignment error is also reduced. The problem of device defect is improved. Furthermore, the sum of the alignment error incurred from forming the gate electrode and the alignment errors incurred from forming the source electrode and the drain electrode of the thin film transistor in the pixel array area will not result in the asymmetric lightly doped drain. The electrical performance of product is thus improved. In summary, applying the present invention method to the practical production line is able to simplify the process, improve the reliability performance, and increase the yield.

In comparison with the prior art method of fabricating the low temperature polysilicon thin film transistor liquid crystal display, the number of the photolithography processes and the ion implantation processes is decreased to simplify the process. The risk and the probability of occurring alignment errors are also reduced to improve the device defect problem to improve the high reliability performance. In addition, the sum of the alignment error incurred from forming the gate electrode and the alignment errors incurred from forming the source electrode and the drain electrode of the thin film transistor in the pixel array area will not result in the asymmetric lightly doped drain, improving the electrical performance of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a liquid crystal display (LCD), the method comprising the steps of:

providing an insulation substrate, a pixel array area and a periphery circuit area defined on the insulation substrate;

forming a polysilicon layer on a surface of the insulation substrate;

performing a first photo-etching-process (PEP-1) to remove portions of the polysilicon layer to respectively form a first active area in the pixel array area and a second active area in the periphery circuit area, a source region, a drain region, a channel region, and a predetermined region for a bottom storage electrode being comprised in the first active area, a source region, a drain region, and a predetermined region for a channel region being comprised in the second active area;

forming a first mask on a surface of the entire structure by performing a second photo-etching-process (PEP-2) to define the channel region in the first active area and the channel region in the second active area;

performing a first ion implantation process by utilizing the first mask as a mask;

removing the first mask;

forming a second mask on the surface of the entire structure by performing a third photo-etching-process (PEP-3) to define the source region, the drain region, and the bottom storage electrode in the first active area and the source region and the drain region in the second active area;

performing a second ion implantation process by utilizing the second mask as a mask to form a source electrode and a drain electrode in the first active area and in the second active area respectively and to dope the bottom storage electrode with dopants simultaneously;

removing the second mask;

forming a first isolation layer on the surface of the entire structure;

forming a metal layer on a surface of the first isolation layer, the first isolation layer and the metal layer covering the first active area, the second active area, and the bottom storage electrode;

performing a fourth photo-etching-process (PEP-4) to remove portions of the metal layer to form a gate insulating layer, a gate electrode, a capacitor dielectric layer, and a top storage electrode in the pixel array area and a gate insulating layer and a gate electrode in the periphery circuit area;

forming a third mask on the surface of the entire structure by performing a fifth photo-etching-process (PEP-5) to define a thin film transistor region;

performing a third ion implantation process by utilizing the third mask as a mask to form a source electrode and a drain electrode in the periphery circuit area;

removing the third mask;

forming a second isolation layer on the surface of the entire structure, the second isolation layer covering each gate electrode and the top storage electrode;

performing a sixth photo-etching-process (PEP-6) to remove portions of the second isolation layer to form a first contact hole extending to the top surface of each source electrode and each drain electrode;

forming a first conductive layer on a surface of the second isolation layer to fill up the first contact hole;

performing a seventh photo-etching-process (PEP-7) to remove portions of the first conductive layer to form a source wire and a drain wire in the pixel array area and the periphery circuit area respectively, the source wire and the drain wire being electrically connected to the source electrode and the drain electrode through the first contact hole respectively; and forming a third isolation layer on the surface of the entire structure, the third isolation layer covering the second isolation layer, the source wire, and the drain wire.

2. The method of claim 1 wherein the insulation substrate comprises a glass substrate or a quartz substrate.

3. The method of claim 1 wherein the method for forming the polysilicon layer further comprises the following steps:

performing a sputtering process to form an amorphous silicon layer ($\alpha$-Si layer) on the surface of the insulating substrate; and performing an annealing process to re-crystallize the amorphous silicon layer to the polysilicon layer.

4. The method of claim 3 wherein the annealing process is an excimer laser annealing (ELA) process.

5. The method of claim 1 wherein the first ion implantation process is a threshold voltage adjustment ion implantation process utilized to adjust the threshold voltage for each thin film transistor.

6. The method of claim 5 wherein the dopants for the first ion implantation process comprise boron atoms ($B_{11}$) or boron fluoride ($BF_2^+$).

7. The method of claim 1 wherein a cleaning process by utilizing an ozone solution to clean the surface of the first active layer, the second active layer, and the bottom storage electrode is comprised before forming the first isolation layer.

8. The method of claim 1 wherein an ion implantation process is comprised after the fourth photo-etching-process to dope the N-type dopants into the first active area and the second active area to form a lightly doped drain (LDD) in the pixel array area and the periphery circuit area respectively.

9. The method of claim 1 wherein the third isolation layer is a planarization layer, the third planarization layer comprises a silicon oxide layer, a silicon nitride layer, or a tetra-ethyl-ortho-silicate oxide layer (TEOS-oxide layer).

10. The method of claim 1 wherein the material composition of the conductive layer comprises indium tin oxide (ITO) or indium zinc oxide (IZO).

11. The method of claim 1 further comprises the following steps:

performing an eighth photo-etching-process (PEP-8) to remove portions of the third isolation layer to form a second contact hole electrically connected to the drain wire;

forming a second conductive layer on the surface of the entire structure; and performing a ninth photo-etching-process (PEP-9) to remove portions of the second conductive layer to form a pixel electrode electrically connected to the drain wire and the drain electrode though the second contact hole.

12. A method of fabricating a liquid crystal display (LCD), the method comprising the steps of:

providing an insulation substrate, a pixel array area, and a periphery circuit area defined on the insulation substrate;

forming a polysilicon layer on a surface of the insulation substrate;

performing a first photo-etching-process (PEP-1) to remove portions of the polysilicon layer to respectively form a first active area in the pixel array area and a second active area in the periphery circuit area, a source region, a drain region, a channel region, and a predetermined region for a bottom storage electrode being comprised in the first active area, a source region, a drain region, and a predetermined region for a channel region being comprised in the second active area;

forming a first mask on a surface of the entire structure by performing a second photo-etching-process (PEP-2) to define the channel region in the first active area and the channel region in the second active area;

performing a first N-type ion implantation process by utilizing the first mask as a mask;

removing the first mask;

forming a second mask on the surface of the entire structure by performing a third photo-etching-process (PEP-3) to define the source region, the drain region, and the bottom storage electrode in the first active area and the source region and the drain region in the second active area;

performing a second N-type ion implantation process by utilizing the second mask as a mask to form an N-type source electrode and an N-type drain electrode in the first active area and in the second active area respectively and to dope the bottom storage electrode with dopants simultaneously;

removing the second mask;

forming a first isolation layer on the surface of the entire structure;

forming a metal layer on a surface of the first isolation layer, the first isolation layer and the metal layer covering the first active area, the second active area, and the bottom storage electrode;

performing a fourth photo-etching-process (PEP-4) to remove portions of the metal layer to form a gate insulating layer, a gate electrode, a capacitor dielectric layer, and a top storage electrode in the pixel array area and a gate insulating layer and a gate electrode in the periphery circuit area;

forming a third mask on the surface of the entire structure by performing a fifth photo-etching-process (PEP-5) to define a thin film transistor region;

performing a third P-type ion implantation process by utilizing the third mask as a mask to form a P-type source electrode and, a P-type drain electrode in the periphery circuit area;

removing the third mask;

forming a second isolation layer on the surface of the entire structure, the second isolation layer covering each gate electrode and the top storage electrode;

performing a sixth photo-etching-process (PEP-6) to remove portions of the second isolation layer to form a first contact hole extending to the top surface of each source electrode and each drain electrode;

forming a first conductive layer on a surface of the second isolation layer to fill up the first contact hole;

performing a seventh photo-etching-process (PEP-7) to remove portions of the first conductive layer to form a source wire and a drain wire in the pixel array area and the periphery circuit area respectively, the source wire and the drain wire being electrically connected to the source electrode and the drain electrode through the first contact hole respectively;

forming a third isolation layer on the surface of the entire structure, the third isolation layer covering the second isolation layer, the source wire, and the drain wire, performing an eighth photo-etching-process (PEP-8) to remove portions of the third isolation layer to form a second contact hole electrically connected to the drain wire;

forming a second conductive layer on the surface of the entire structure; and performing a ninth photo-etching-process (PEP-9) to remove portions of the second conductive layer to form a pixel electrode electrically connected to the drain wire and the drain electrode though the second contact hole.

13. The method of claim 12 wherein the method for forming the polysilicon layer further comprises the following steps:

performing a sputtering process to form an amorphous silicon layer (α-Si layer) on the surface of the insulating substrate; and performing an annealing process to re-crystallize the amorphous silicon layer to the polysilicon layer.

14. The method of claim 13 wherein the annealing process is an excimer laser annealing (ELA) process.

15. The method of claim 12 wherein the first N-type ion implantation process is a threshold voltage adjustment ion implantation process utilized to adjust the threshold voltage for each thin film transistor.

16. The method of claim 15 wherein the dopants for the first N-type ion implantation process comprise boron atoms ($B_{11}$) or boron fluoride ($BF_2^+$).

17. The method of claim 12 wherein a cleaning process by utilizing an ozone solution to clean the surface of the first active layer, the second active layer, and the bottom storage electrode is comprised before forming the first isolation layer.

18. The method of claim 12 wherein the first isolation layer is a single-layered structure or a double-layered structure and the material composition of the first isolation layer comprises tetra-ethyl-ortho-silicate oxide (TEOS-oxide), silicon oxide, silicon nitride, or a combination thereof.

19. The method of claim 12 wherein the thickness of the gate insulating layer is less than the thickness of the gate electrode.

20. The method of claim 12 wherein the third isolation layer is a planarization layer, the third planarization layer comprises a silicon oxide layer, a silicon nitride layer, or a tetra-ethyl-ortho-silicate oxide layer (TEOS-oxide layer).

* * * * *